(12) United States Patent  
Wang et al.

(10) Patent No.: US 10,700,135 B2  
(45) Date of Patent: Jun. 30, 2020

(54) ORGANIC LIGHT-EMITTING DIODE DISPLAY PANEL AND ORGANIC LIGHT-EMITTING DIODE DISPLAY DEVICE

(71) Applicants: Shanghai Tianma AM-OLED Co., Ltd., Shanghai (CN); Tianma Micro-Electronics Co., Ltd., Shenzhen (CN)

(72) Inventors: Xiangcheng Wang, Shanghai (CN); Jinghua Niu, Shanghai (CN); Wei He, Shanghai (CN); Yuji Hamada, Shanghai (CN); Chen Liu, Shanghai (CN); Honggang Yan, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 325 days.

(21) Appl. No.: 15/593,881

(22) Filed: May 12, 2017

(65) Prior Publication Data

US 2017/0250235 A1   Aug. 31, 2017

(30) Foreign Application Priority Data

Nov. 21, 2016   (CN) .......................... 2016 1 1039523

(51) Int. Cl.
  *H01L 27/32*   (2006.01)
  *H01L 51/00*   (2006.01)
  (Continued)

(52) U.S. Cl.
  CPC ...... *H01L 27/3216* (2013.01); *H01L 51/0097* (2013.01); *H01L 51/5056* (2013.01);
  (Continued)

(58) Field of Classification Search
  CPC ........................ H01L 27/3216; H01L 51/0097
  (Continued)

(56) References Cited

U.S. PATENT DOCUMENTS

2014/0057379 A1*   2/2014   Park ........................ B41M 5/46  
438/46

FOREIGN PATENT DOCUMENTS

| CN | 101399319 A | 4/2009 |
| CN | 104576950 A | 4/2015 |
| TW | 201220568 A | 5/2012 |

* cited by examiner

*Primary Examiner* — Bo Fan  
(74) *Attorney, Agent, or Firm* — Anova Law Group, PLLC (57) ABSTRACT

An organic light-emitting diode (OLED) display panel and an OLED display device are provided. The OLED display panel comprises a first substrate; a first electrode layer disposed on the first substrate and including a plurality of first electrodes; a hole transport layer disposed on a surface of the first electrode layer far away from the first substrate, and formed by a first hole transport material and a second hole transport material having different carrier mobility; a plurality of light-emitting devices disposed on a surface of the hole transport layer far away from the first electrode layer and arranged in correspondence with the plurality of first electrodes respectively; an electron transport layer disposed on a surface of the plurality of light-emitting devices far away from the hole transport layer; and a second electrode layer disposed on a surface of the electron transport layer far away from the plurality of light-emitting devices.

20 Claims, 4 Drawing Sheets

(51) Int. Cl.
*H01L 51/50* (2006.01)
*H01L 51/52* (2006.01)
(52) U.S. Cl.
CPC ...... *H01L 51/5072* (2013.01); *H01L 51/5271* (2013.01); *H01L 27/3211* (2013.01); *H01L 51/004* (2013.01); *H01L 51/006* (2013.01); *H01L 51/0056* (2013.01); *H01L 51/0058* (2013.01); *H01L 51/5064* (2013.01); *H01L 2251/301* (2013.01); *H01L 2251/308* (2013.01); *H01L 2251/5338* (2013.01); *H01L 2251/552* (2013.01)
(58) Field of Classification Search
USPC .............................................. 257/40; 438/46
See application file for complete search history.

ORGANIC LIGHT-EMITTING DIODE DISPLAY PANEL AND ORGANIC LIGHT-EMITTING DIODE DISPLAY DEVICE

CROSS-REFERENCES TO RELATED APPLICATIONS

This application claims priority of Chinese Patent Application No. 201611039523.2, filed on Nov. 21, 2016, the entire contents of which are hereby incorporated by reference.

FIELD OF THE INVENTION

The present disclosure generally relates to the field of organic light-emitting diode (OLED) technology and, more particularly, relates to an OLED display panel and an OLED display device.

BACKGROUND

An organic light-emitting diode (OLED) display panel is a self-luminous display device with an organic thin film as a luminous body, which has the advantages of ultra-thin thickness, high brightness, high luminous efficiency and good shock resistance. In an OLED display panel, each subpixel area is often defined by a pixel definition layer. To improve the package or encapsulation of the subpixel packaging, spacers are provided on the pixel defining layer between any two adjacent subpixels.

However, in an existing OLED display panel, subpixels adjacent to a subpixel which is turned on may emit undesired light, such that the crosstalk of the OLED display panel may be increased, and the display performance of the OLED display panel may be degraded.

The disclosed OLED display panel and OLED display device thereof are directed to solve one or more problems set forth above and other problems.

BRIEF SUMMARY OF THE DISCLOSURE

One aspect of the present disclosure provides an organic light-emitting diode (OLED) display panel. The OLED display panel comprises a first substrate; a first electrode layer disposed on the first substrate and including a plurality of first electrodes; a hole transport layer disposed on a surface of the first electrode layer far away from the first substrate, and formed by a first hole transport material and a second hole transport material having different carrier mobility; a plurality of light-emitting devices disposed on a surface of the hole transport layer far away from the first electrode layer and arranged in correspondence with the plurality of first electrodes respectively; an electron transport layer disposed on a surface of the plurality of light-emitting devices far away from the hole transport layer; and a second electrode layer disposed on a surface of the electron transport layer far away from the plurality of light-emitting devices.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

Figure 1:
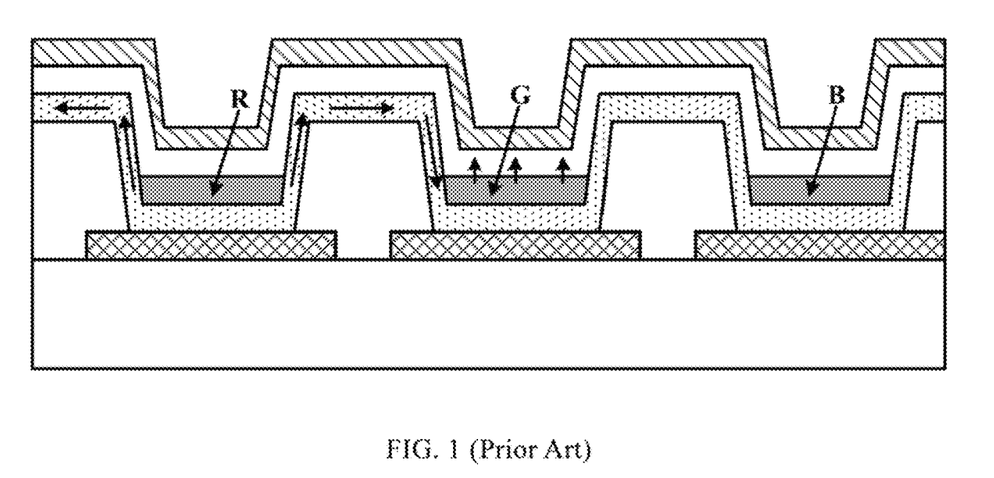
FIG. 1 illustrates a schematic view of an existing organic light-emitting diode (OLED) display panel.

FIG. 1 illustrates a schematic view of an existing organic light-emitting diode (OLED) display panel. As shown in FIG. 1, the subpixels of the OLED display panel are arranged in the order of red subpixel R, green subpixel G and blue subpixel B. When the red subpixel R is intentionally lit or turned on, the carriers in the red subpixel R may drift laterally to the surrounding subpixels, for example, drift laterally to the adjacent green subpixel G. Consequently, the green subpixel G may emit visible green light due to the high luminous efficiency of the green subpixel G due to the high luminous efficiency of the green subpixel G.

That is, the green subpixel G is undesirably lit or may emit undesired light when the red subpixel R is intentionally turned on. Accordingly, the red subpixel R is undesirably lit when the green subpixel G is intentionally turned on. The red subpixel R and the green subpixel G are undesirably lit when B is intentionally lit. The undesired light is emitted by the subpixels adjacent to the subpixel that is intentionally turned on. As a result, the crosstalk of the OLED display panel may be increased, and the display performance of the OLED display panel may be degraded accordingly.

The present disclosure provides an improved display panel capable of suppressing the undesired light emitted by the adjacent subpixels and, thus, reducing the crosstalk and improving the display performance.

Figure 2:
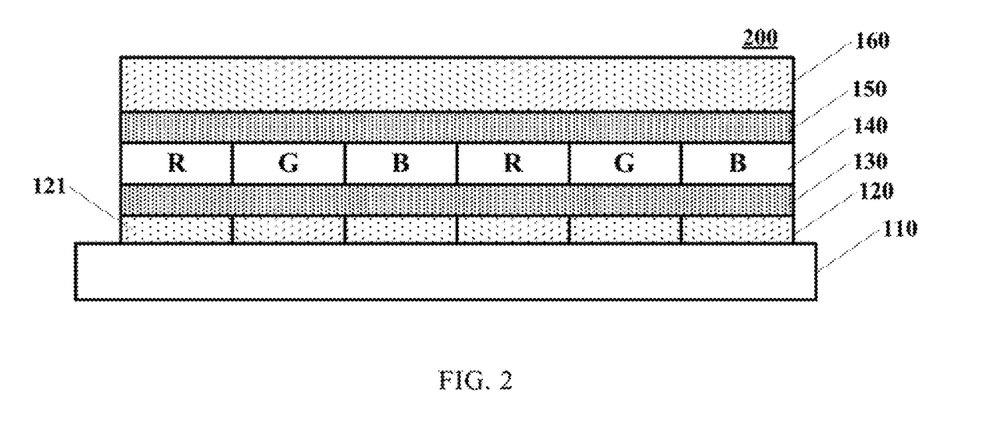
FIG. 2 illustrates a schematic view of an exemplary OLED display panel consistent with disclosed embodiments.

FIG. 2 illustrates a schematic view of an exemplary OLED display panel consistent with disclosed embodiments. As shown in FIG. 2, the organic OLED display panel 200 may comprise: a first substrate 110, a first electrode layer 120, a hole transport layer 130, a plurality of light-emitting devices 140, an electron transport layer 150, a second electrode layer 160, and a plurality of first electrodes 121. Other appropriate components may also be included.

The first electrode layer 120 may be disposed on the first substrate 110, and the first electrode layer 120 may include the plurality of first electrodes 121. The hole transport layer 130 may be disposed on the surface of the first electrode layer 120 far away from the first substrate 110, and the hole transport layer 130 may be formed by mixing a first hole transport material and a second hole transport material with different mobility.

The plurality of light-emitting devices 140 may be disposed on the surface of the hole transport layer 130 far away from the first electrode layer 120, and may be disposed in correspondence with the plurality of first electrodes 121, respectively. The electron transport layer 150 may be disposed on the plurality of light-emitting devices 140 far away from the hole transport layer 130. The second electrode layer 160 may be disposed on the electron transport layer 150 far away from the plurality of light-emitting devices 140.

The first substrate 110 may be made of rigid transparent materials (e.g., glass) or flexible transparent materials (e.g., polyimide). The light-emitting device may include organic light-emitting diode (OLED) devices, quantum dots (QDs) light-emitting devices, or other appropriate light-emitting devices capable of emitting light for displaying videos and/or images.

In one embodiment, as shown in FIG. 2, the first substrate 110 may be a flexible substrate, and the light-emitting device may be an OLED device. That is, the corresponding OLED display panel 200 may be a flexible OLED display panel. The flexible OLED display panel may have characteristics such as low power consumption and good flexibility, and may be applicable to various display devices such as wearable display devices. The material of the flexible substrate may include polyimide or polyethylene terephthalate resin, which is for illustrative purposes and is not intended to limit the scope of the present disclosure. Any materials suitable for the flexible substrate fall within the scope of the disclosure.

In another embodiment, the first substrate may be a rigid substrate and, accordingly, a rigid OLED display panel may be provided. The rigid OLED display panel may have broad applications and will not be further described in the present disclosure. In practical applications, the materials of the first substrate may be selected according to various application scenarios.

In the disclosed embodiments, the first electrode layer 120 may be disposed on the first substrate 110, and the first electrode layer 120 may include the plurality of first electrodes 121. According to the structure of the OLED display panel, in one embodiment, as shown in FIG. 2, the first electrode layer 120 may be an anode of the OLED display panel 200. That is, a positive voltage may be applied to the first electrodes 121 of the first electrode layer 120 during electroluminescence.

The first electrode layer 120 may include a high work function material, such as indium tin oxide or tin-doped indium oxide (ITO) having a work function as high as approximately 4.5 eV to 5.3 eV, good stability and high transparency. In one embodiment, the first electrode 121 may include at least: a reflective film and a transparent conductive film. The reflective film may be disposed on the first substrate 110, and the material of the reflective film may include silver. The transparent conductive film may be disposed on the surface of the reflective film far away from the first substrate 110, and the material of the transparent conductive thin film may include indium tin oxide (ITO), and indium zinc oxide, etc.

The materials and the film configuration of the first electrode layer are for illustrative purposes and are not intended to limit the scope of the present disclosure. The materials and the film configuration of the first electrode layer may be selected according to various application scenarios.

The second electrode layer 160 may be disposed on the surface of the electron transport layer 150 far away from the plurality of light-emitting devices 140. In one embodiment, as shown in FIG. 2, the second electrode layer 160 may be a cathode of the OLED display panel 200. That is, a negative voltage may be applied to the second electrode layer 160 during electroluminescence.

The second electrode layer 160 may include a low work function material such as Ag, Al, Ca, In, Li, Mg, or a low work function composite metal material. For example, the second electrode layer 160 may include at least one of a magnesium-silver alloy, a silver-metal, a silver-ytterbium alloy, and a silver-rare earth metal alloy, which is for illustrative purposes and is not intended to limit the scope of the present disclosure. The materials of the second electrode layer may be selected according to various application scenarios.

The plurality of light-emitting devices 140 may be disposed in correspondence with the plurality of the first electrodes 121 respectively. That is, the plurality of light-emitting devices 140 may be disposed one-to-one corresponding to the plurality of the first electrodes 121. The light-emitting devices 140 may be disposed between the first electrode layer 120 and the second electrode layer 160. Each light-emitting device 140 may be a subpixel.

In the light-emitting device 140, when a positive voltage is applied to the first electrode 121 and a negative voltage is applied to the second electrode layer 160, the holes generated by the first electrode 121 as the anode may be injected into the corresponding light-emitting device 140, and, meanwhile, the electrons generated by the second electrode layer 160 as the cathode may also be injected into the corresponding light-emitting device 140. The binding of the electrons and holes injected into the light-emitting device 140 may generate excitons. Subsequent radiative transition of the excitons may enable the light-emitting device 140 to emit light.

Further, the light-emitting devices 140 may have m number of colors, where m is a positive integer. In one embodiment, m may be greater than or equal to 3. The light-emitting devices 140 of different colors may emit light in different colors. For example, a red light-emitting device may emit red light, and may be considered as a red subpixel.

In the disclosed embodiments, the material of the light-emitting device may include organic small-molecule light-emitting materials or high-molecular-weight polymer light-emitting materials, which are not limited by the present disclosure.

In one embodiment, as shown in FIG. 2, m may be equal to 3, and the plurality of light-emitting devices 140 may include a plurality of red light-emitting devices R, a plurality of green light-emitting devices G, and a plurality of blue light-emitting devices B. In another embodiment, m may be equal to 4, and the light-emitting devices may include a plurality of red light-emitting devices, a plurality of green light-emitting devices, and a plurality of blue light-emitting devices, and further a plurality of yellow light-emitting devices or a plurality of white light-emitting devices. The colors and number of the light-emitting devices are for illustrative purposes and are not intended to limit the scope of the present disclosure. In particular application, the colors and number of the light-emitting devices may vary according to various application scenarios.

To further explain the technical solutions provided in the disclosed embodiments, an OLED display panel in which the light-emitting devices are arranged in specific colors will be described as an example. For example, in one embodiment, as shown in FIG. 2, the plurality of light-emitting devices 140 may be arranged in a row direction and a column direction. That is, the plurality of light-emitting devices 140 may be arranged in a matrix. Given m=3, the light-emitting devices 140 in any row may be arranged by the colors of red (R), green (G), blue (B), red (R), green (G), blue (B). Every three light-emitting devices 140 in a same row may constitute one pixel.

In certain embodiments, the order of color arrangement of any two adjacent rows of light-emitting devices (i.e., any two adjacent light-emitting device rows) may be different. For example, the first row of light-emitting devices may be arranged in an order of R, G, B, R, G and B, and the second row of light-emitting devices may be arranged in an order of B, R, G, B, R and G, which are for illustrative purposes and are not intended to limit the scope of the present disclosure. In practical applications, the color arranging order of the light-emitting devices may vary according to various application scenarios.

In order to improve the luminous efficiency of the light-emitting devices 140, the light-emitting devices 140 may further include the hole transport layer 130 and the electron transport layer 150.

The hole transport layer 130 may be disposed on the surface of the first electrode layer 120 far away from the first substrate 110. The plurality of light-emitting devices 140 may be disposed on the surface of the hole transport layer 130 far away from the first electrode layer 120. The electron transport layer 150 may be disposed on the surface of the plurality of light-emitting devices 140 far away from the hole transport layer 130. The hole transport layer 130 may be disposed between the first electrode layer 120 and the plurality of light-emitting devices 140, such that the capability of the anode to inject and transport holes to the light-emitting devices 140 may be enhanced.

The electron transport layer 150 may be disposed between the plurality of light-emitting devices 140 and the second electrode layer 160, such that the capability of the cathode to inject and transport electrons to the light-emitting devices 140 may be enhanced. Thus, more holes and electrons may be injected into the light-emitting devices 140, and, accordingly, the recombination efficiency and the luminous efficiency of the light-emitting devices 140 may be improved.

Those skilled in the art would understand that the structures described and illustrated in the disclosed embodiments are only partial structures of an OLED display panel. An OLED display panel also includes other structures such as a glass cover plate and etc., which are not further described and illustrated in the present disclosure.

As discussed in the background, in an existing OLED display panel, undesired light is emitted by subpixels adjacent to turned-on subpixels. For example, in an existing OLED panel in which red subpixels R, green subpixels G and blue subpixels are alternately arranged, when the red subpixel R is intentionally turned on, some of the carriers injected into the red subpixel R may drift laterally to the neighboring subpixels through the hole transport layer, for example, to the adjacent green subpixel G. Then the excitons formed by the binding of the injected electrons and holes in the green subpixel G may enable the subpixel G to emit undesired green light by electroluminescence.

That is, in the existing OLED display panel, when one subpixel is turned on, some of the carriers in the lighted or turned-on subpixel may laterally drift to the adjacent subpixels through the hole transport layer, such that undesired light may be emitted by the subpixels adjacent to turned-on subpixels and the crosstalk may be increased.

To solve one or more problems set forth above, in the disclosed embodiments, the hole transport layer 130 may be formed by mixing the first hole transport material and the second hole transport material having different mobility. When the hole transport layer 130 is formed by the first hole transport material and the second hole transport material having different mobility, the carriers of the turned-on light-emitting device 140 may have a reduced lateral drift velocity. That is, the lateral current may be reduced, such that the number of carriers injected laterally into the adjacent light-emitting device 140 may be significantly reduced.

Compared to the existing OLED display panel discussed in the background, the hole transport layer in disclosed embodiments may reduce the lateral drift velocity of the carriers in the turned-on light-emitting device 140 drifting to the adjacent light-emitting devices 140, i.e., reduce the lateral current. Thus, the number of carriers injected laterally into the adjacent light-emitting devices 140 may be significantly reduced, thereby suppressing undesired light emitted by the light-emitting devices adjacent to the turned-on light-emitting device.

In addition, the number of carriers leaked through the hole transport layer 130 from the light-emitting device 140 may be reduced, and accordingly the luminous efficiency of the light-emitting device 140 may be improved.

In the disclosed embodiments, the OLED display panel may comprise the hole transport layer formed by mixing the first hole transport material and the second hole transport material having different mobility. Different from the existing OLED display panel discussed in the background, the hole transport layer of the OLED display panel in disclosed embodiments may reduce the lateral drift velocity of the carriers in the turned-on light-emitting device drifting to the adjacent light-emitting devices. The number of carriers injected laterally into the adjacent light-emitting devices may be significantly reduced, thereby suppressing undesired light emitted by the light-emitting devices adjacent to the turned-on light-emitting device. Accordingly, the luminous efficiency of the light-emitting device and the display performance of the OLED display panel may be improved.

Figure 3A:
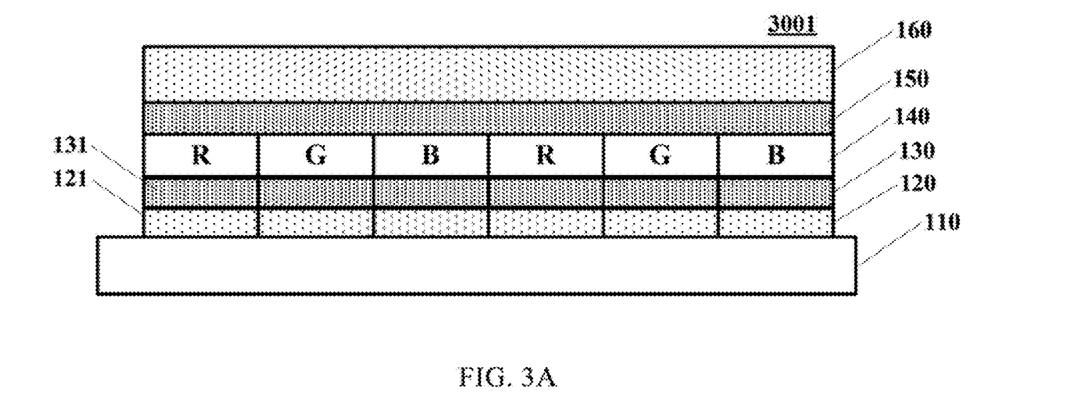
FIG. 3A illustrates a schematic view of another exemplary OLED display panel consistent with disclosed embodiments.

FIG. 3A illustrates a schematic view of another exemplary OLED display panel consistent with disclosed embodiments. The similarities between FIG. 3A and FIG. 2 may not be repeated here, while certain differences may be explained. As shown in FIG. 3A, different from the OLED display panel 200 in FIG. 2, the hole transport layer 130 of the OLED display panel 3001 in FIG. 3 may further comprise a plurality of first hole transport units 131.

In particular, the plurality of first hole transport units 131 may be disposed in correspondence with the plurality of light-emitting devices 140, respectively. The plurality of light-emitting devices 140 may be disposed on the surface of the first hole transport layer 130 far away from the first electrode layer 120. The first hole transport unit 131 may be formed by mixing the first hole transport material and the second hole transport material having different mobility.

The first hole transport unit 131 may reduce the lateral drift velocity of the carriers in the corresponding light-emitting device 140 drifting to the adjacent light-emitting devices 140, i.e., reduce the lateral current. Thus, the number of carriers injected laterally into the adjacent light-emitting devices 140 may be significantly reduced, thereby suppressing undesired light emitted by the light-emitting devices adjacent to the turned-on light-emitting devices in the OLED display panel. Accordingly, the luminous efficiency of the light-emitting device 140 and the display performance of the OLED display panel may be improved.

Figure 3B:
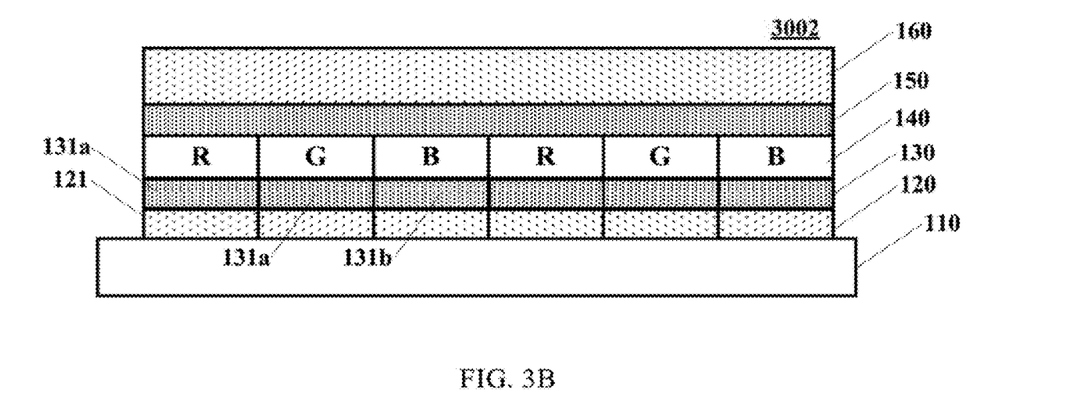
FIG. 3B illustrates a schematic view of another exemplary OLED display panel consistent with disclosed embodiments.

FIG. 3B illustrates a schematic view of another exemplary OLED display panel consistent with disclosed embodiments. The similarities between FIG. 3B and FIG. 2 may not be repeated here, while certain differences may be explained.

As shown in FIG. 3B, different from the OLED display panel 200 in FIG. 2, the hole transport layer 130 of the OLED display panel 3002 in FIG. 3B may further comprise a plurality of first hole transport units, and the plurality of first hole transport units may comprise a plurality of first hole transport units 131a and a plurality of first hole transport units 131b.

In particular, the hole transport units 131a corresponding to the light-emitting devices 140 of at most (m−1) number of colors may be formed by a first hole transport material or a second hole transport material, where m is a positive integer greater than or equal to 3. The hole transport units 131b corresponding to the light-emitting devices 140 of at least one color may be formed by mixing at least the first hole transport material and the second hole transport material.

In one embodiment, as shown in FIG. 3B, the hole transport unit 131b may correspond to the blue light-emitting device B and may be formed by mixing the first hole transport material and the second hole transport material. The hole transport unit 131a may correspond to the green light-emitting device G and may be formed by the first hole transport material or the second hole transport material, and the hole transport unit 131a may also correspond to the red light-emitting device R and may be formed by the first hole transport material or the second hole transport material.

The first hole transport material and the second hole transport material may be provided with different mobility. The hole transport unit 131b, which is formed by mixing the first hole transport material and the second hole transport material having different mobility, may reduce the lateral drift velocity of the carriers of the corresponding light-emitting device 140 (e.g. the blue light-emitting device B) drifting to the adjacent light-emitting devices 140 (e.g., the green light-emitting device G and the red light-emitting device R). That is, the lateral current may be reduced.

Thus, the number of carriers injected laterally into the adjacent light-emitting devices 140 may be significantly reduced, thereby suppressing the undesired light emitted by the light-emitting devices which are adjacent to the turned-on light-emitting devices in the OLED display panel. Accordingly, the luminous efficiency of the light-emitting device 140 and the display performance of the OLED display panel may be improved.

It should be noted that, FIG. 3B shows the hole transport units 131b formed by mixing the first hole transport material and the second hole transport material may correspond to the blue light-emitting devices B, and the hole transport units 131a formed by the first hole transport material or the second hole transport material may correspond to the green light-emitting devices G and the red light-emitting devices R, which is for illustrative purposes and is not intended to limit the scope of the present disclosure.

For example, in another embodiment, the hole transport units 131b formed by mixing the first hole transport material and the second hole transport material may correspond to the green light-emitting devices G, and the hole transport units 131a formed by the first hole transport material or the second hole transport material may correspond to the blue light-emitting devices B and the red light-emitting devices R.

Figure 4:
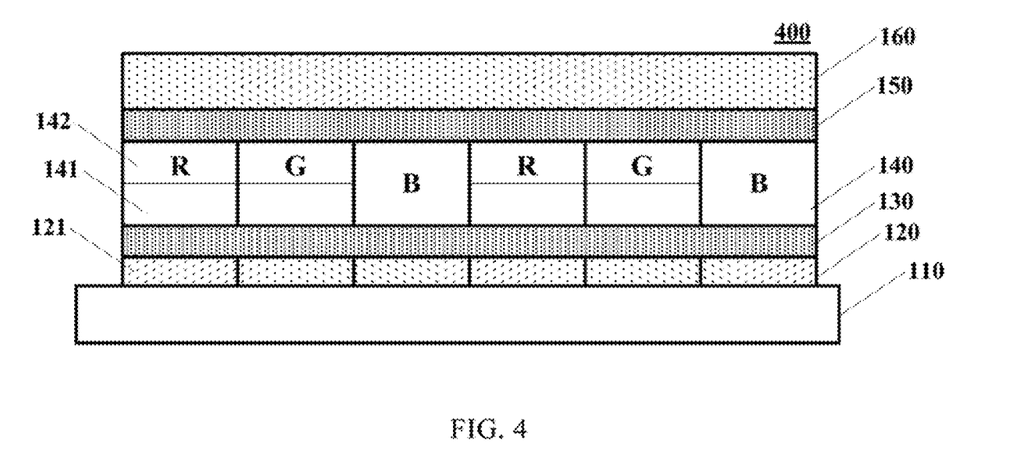
FIG. 4 illustrates a schematic view of another exemplary OLED display panel consistent with disclosed embodiments.

FIG. 4 illustrates a schematic view of another exemplary OLED display panel consistent with disclosed embodiments. The similarities between FIG. 4 and FIG. 2 may not be repeated here, while certain differences may be explained.

As shown in FIG. 4, different from the OLED display panel 200 in FIG. 2, in the OLED display panel 400 in FIG. 4, the light-emitting device 140 of at least one color may comprise a second hole transport unit 141 and a light-emitting unit 142 arranged in a stacked configuration. In particular, the second hole transport unit 141 may be disposed on the surface of the hole transport layer 130 far away from the first electrode layer 120.

In one embodiment, as shown FIG. 4, the light-emitting devices 140 of two colors may comprise the second hole transport unit 141 and the light-emitting unit 142 arranged in a stacked configuration. For example, the red light-emitting device R may comprise the second hole transport unit 141 and the light-emitting unit 142 which are arranged in layers, and the green light-emitting device G may comprise the second hole transport unit 141 and the light-emitting unit 142 which are arranged in layers.

The second hole transport units 141 may be formed by at least one of the first hole transport material and the second hole transport material. The second hole transport units 141, which are disposed on the surface of the hole transport layer 130 far away from the first electrode layer 120, may enhance the capability of the first electrode layer 120 to inject and transport holes. Thus, the number of holes injected into the corresponding light-emitting units 142 may be increase and, accordingly, the luminous efficiency of the corresponding light-emitting units 142 may be improved.

It should be noted that, FIG. 4 shows the red light-emitting device R may comprise the second hole transport unit 141 and the light-emitting unit 142 which are arranged in layers, and the green light-emitting device G may comprise the second hole transport unit 141 and the light-emitting unit 142 which are arranged in layers, which are for illustrative purposes and are not intended to limit the scope of the present disclosure. The light-emitting device 140 of at least one color comprising the second hole transport unit 141 and the light-emitting unit 142 may be selected according to various application scenarios.

Figure 5:
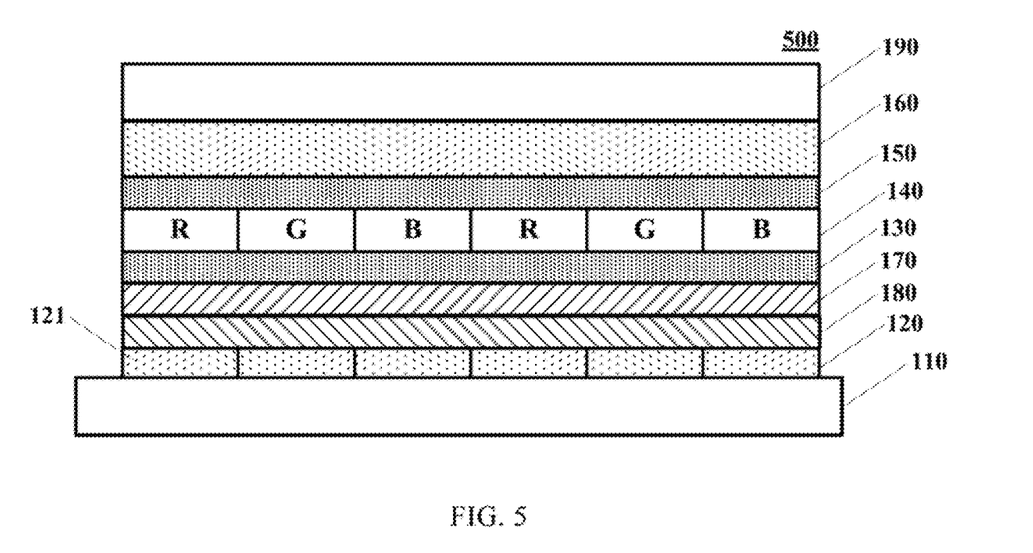
FIG. 5 illustrates a schematic view of another exemplary OLED display panel consistent with disclosed embodiments.

FIG. 5 illustrates a schematic view of another exemplary OLED display panel consistent with disclosed embodiments. The similarities between FIG. 5 and FIG. 2 may not be repeated here, while certain differences may be explained.

As shown in FIG. 5, different from the OLED display panel 200 in FIG. 2, the OLED display panel 500 in FIG. 5 may further comprise a hole injection layer 170, a buffer layer 180 and a capping layer 190.

In particular, the hole injection layer 170 may be disposed on the surface of the hole transport layer 130 far away from the plurality of light-emitting devices 140. The buffer layer 180 may be disposed between the first electrode layer 120 and the hole injection layer 170. The capping layer 190 may be disposed on the surface of the second electrode layer 160 far away from the plurality of light-emitting devices 140.

Both the hole injection layer 170 and the buffer layer 180 may be able to reduce the interfacial potential barrier between the first electrode layer 120 and the hole transport layer 130, and minimize the energy barrier when the holes are transited from the first electrode layer 120, thereby increasing the hole injection and transport capacity. Thus, more holes may be injected into the light-emitting devices 140, and, accordingly, the recombination efficiency and the luminous efficiency of the light-emitting devices 140 may be increased.

In certain embodiments, the OLED display panel may further comprise film structures such as an electron injection layer, an electron blocking layer, and a hole blocking layer. The film structure of the OLED display panel may vary according to various application scenarios. Film structures are not limited by the present disclosure.

In the disclosed embodiments, the absolute value of the difference between the lowest unoccupied orbital LUMO1 of the first hole transport material and the lowest unoccupied orbital LUMO2 of the second hole transport material may be determined according to various application scenarios. In one embodiment, the absolute value of the difference between the lowest unoccupied orbital LUMO1 of the first hole transport material and the lowest unoccupied orbital LUMO2 of the second hole transport material may be greater than or equal to approximately 0.2 eV. LUMO stands for the lowest unoccupied molecular orbital, and LUMO is often called the LUMO energy level, and the energy level of the lowest unoccupied molecular orbital is the value of the LUMO.

When the absolute value of the difference between LUMO1 of the first hole transport material and LUMO2 of the second hole transport material is greater than or equal to approximately 0.2 eV, the energy level of the lowest unoccupied molecular orbital of the first hole transport material and the energy level of the second hole transport material may have substantially large difference.

Thus, when drifting laterally in the hole transport layer 130, the carriers may not transit easily from the LUMO1 energy level of the first hole transport material to the LUMO2 energy level of the second hole transport material, and may not transit easily from the LUMO2 energy level of the second hole transport material to the LUMO1 energy level of the first hole transport material. The hole transport layer 130 in the disclosed embodiments may reduce the lateral drift velocity of the carriers, i.e., reduce the lateral current. Thus, the number of the carriers injected laterally into the adjacent light-emitting devices 140 may be significantly reduced, and the undesired light emitted by the light-emitting devices adjacent to the turned-on light-emitting device may be suppressed.

Further, the ratio of the hole mobility of the first hole transport material to the hole mobility of the second hole transport material may be determined according to various application scenarios. In one embodiment, the ratio of the hole mobility of the first hole transport material to the hole mobility of the second hole transport material may be greater than or equal to approximately 10. Provided that the hole transport layer 130 is formed by mixing the first hole transport material and the second hole transport material, when the holes are drifting laterally in the hole transport layer 130, the holes may be prevented from transiting from the first hole transport material to the second hole transport material and, meanwhile, prevented from transiting from the second hole transport material to the first hole transport material.

Thus, the hole transport layer 130 may reduce the lateral drift velocity of the holes, i.e., reduce the lateral hole current, and, accordingly, the number of the holes injected into the light-emitting devices 140 adjacent to the turned-on light-emitting device may be significantly reduced. That is, the number of the holes injected into the light-emitting devices 140 adjacent to the turned-on light-emitting device may be reduced. Accordingly, the brightness of the light emitted by the light-emitting device 140 adjacent to the turned-on light-emitting device, i.e., the brightness of the undesired light may be too lower to be observed by human eyes. Thus, through reducing the lateral hole current in the hole transport layer, the undesired light emitted by the light-emitting devices adjacent to the turned-on light-emitting device in the OLEI) display panel may be suppressed.

In practical applications, the first hole transport material and the second hole transport material may vary according to various application scenarios. In one embodiment, the first hole transport material may include carbazole-containing compounds or triphenylamine-containing compounds; and the second hole transport material may include carbazole-containing compounds or triphenylamine-containing compounds. The interfacial potential barrier between the hole transport material and the anode may be substantially low, thereby facilitating the injection and transport of holes. Meanwhile, the hole transport materials may be desired to have good thermal stability, which may maintain the structure stability of the display device and suppress the performance degradation.

For example, aromatic triamine-containing compounds or carbazole-containing compounds may be selected as the hole transport materials, which have low ionization energy and strong electron-donating ability, and exhibit hole transport characteristics during constant electron-donating process. Aromatic triamine compounds may have high hole mobility. In one embodiment, the aromatic triamine compounds may be selected as the triphenylamine-containing compounds.

The hole transport materials may include, but are not limited to, carbazole-containing compounds or triphenylamine-containing compounds, and any appropriate hole transport materials may be selected according to various application scenarios. The hole transport materials are not limited by the present disclosure.

In one embodiment, both the red light-emitting device R and the green light-emitting device G may include a phosphorescent material. The blue light-emitting device B may include a fluorescent material. That is, the phosphorescent material may serve as the luminescent material for the red light-emitting device R and the green light-emitting device G, and the fluorescent material may serve as the luminescent material for the blue light-emitting device B.

The red phosphorescent materials adopted by the red light-emitting device R and the green phosphorescent materials adopted by the green light-emitting device may lead to high luminous efficiency and long lifetime which meet the commercial requirements. The blue fluorescent material adopted by the blue light-emitting device B may lead to a desired long lifetime to meet the commercial requirements. As a comparison, the lifetime of the blue phosphorescent material may be substantially short to meet the commercial requirements.

The red light-emitting device R comprising the red phosphorescent materials, the green light-emitting device G comprising green phosphorescent material, and the blue light-emitting device B comprising the blue fluorescent material may have substantially large difference in the external quantum efficiency. Given a current density of 10 mA/cm², the external quantum efficiency of the red light-emitting device R may be greater than or equal to approximately 18%, the external quantum efficiency of the green light-emitting device G may be greater than or equal to approximately 18%, and the external quantum efficiency of the blue light-emitting device B may be greater than or equal to approximately 10%.

External quantum efficiency is explained as following. When the photons are incident onto the surface of a photosensitive device, some of the photons may stimulate the photosensitive material to produce electron-hole pairs to create a current, in which the ratio of the electrons generated to the number of all the incident photon is the external quantum efficiency.

The higher the external quantum efficiency, the higher the brightness of a light-emitting device. The undesired light emitted by the light-emitting devices adjacent to the turned-on light-emitting device may be related to the high brightness of the light-emitting devices. Because the external quantum efficiencies of the red light-emitting device R and the green light-emitting device G are substantially high, the undesired light may be emitted by the red light-emitting device R and the green light-emitting device G.

In the disclosed embodiments, through adopting the hole transport layer, the lateral drift current of the holes may be reduced, and the undesired light emitted by the light-emitting devices adjacent to the turned-on light-emitting device may be reduced. Those skilled in the art would understand that, the hole transport layer may be able to suppress the undesired light emitted by the light-emitting devices adjacent to the turned-on light-emitting device in any OLED display panels, not limited to the OLED display panels in which the undesired light emitted by the light-emitting devices are caused by high external quantum efficiency.

In one embodiment, the red light-emitting device R may include one first host material or two first host materials, and the first host material may include a carbazole-containing compound. The green light-emitting device G may include at least two second host materials, and the second host material may include a carbazole-containing compound. The blue light-emitting device B may include one third host material or two third host materials, and the third host material may include an aromatic compound.

The carbazole compound may have a substantially high triplet energy, as well as the hole transport and electron transport properties. The carbazole compound included in the host material may enable the host material to have a sufficiently large triplet energy and carrier transport properties. The aromatic compound may have a large conjugated plane, as well as a relatively strong electron accepting ability and electron transport properties, but may not form a complex with luminescent materials.

Those skilled in the art would understand that a variety of carbazole-containing compounds may be used as the host material of the red light-emitting device, and a variety of carbazole-containing compounds may be used as the host material of the green light-emitting device, and a variety of aromatic compounds may be used as the host material of the blue light-emitting device, which are not limited by the present disclosure.

In one embodiment, the first hole transport material may include the hole transport material HTL1 described in the compound (1), and the second hole transport material may include the hole transport material HTL2 described in the compound (2), In another embodiment, the first hole transport material may include the hole transport material HTL3 described in the compound (3), and the second hole transport material may include the hole transport material HTL2 described in the compound (2), (2)

The hole transport materials are for illustrative purposes and are not intended to limit the scope of the present disclosure. The hole transport materials may vary according to various application scenarios.

Further, three exemplary OLED display panels (examples 1 to 3) are given below to illustrate the influence of the hole transport layer on the display performance of the OLED display panels, in which the hole transport layer includes two hole transport materials of different mobility. Only the buffer layer Buffer, the hole injection layer HIL, the hole transport layer, the light-emitting devices, the electron transport layer ETL, the second electrode layer (Cathode), and the capping layer of the OLED display panel of three examples are described below. The OLED display panel may also include other appropriate components, which are not illustrated here.

In the three OLED display panels (examples 1 to 3), the buffer material forming the buffer layer Buffer may include compounds having a chemical formula of The hole injection material forming the hole injection layer HIL may comprise a compound having a chemical formula of

The electron transport layer ETL may be formed by mixing the following material ETL1 and material ETL2:

ETL1

, and

ETL2

.

The cathode material for forming the second electrode layer (Cathode) may include a magnesium-silver alloy.

The capping material for forming the capping layer CPL may include a compound having a chemical formula of

The red light-emitting device R of the OLED display panel in each of the 3 examples may be formed by a hole transport unit (R-prime) and a red light-emitting unit. The hole transport unit (R-prime) may be formed by mixing two hole transport materials having different carrier mobility.

The red light-emitting unit R may comprise a red host light-emitting material R-host and a red phosphorescent material R-dopant, in which the R-host may include the following compound (R-1) and the R-dopant may include the following compound (R-2):

(R-1)

, and

(R-2)

The green light-emitting device G of the OLED display panel in each of the 3 examples may be formed by a hole transport unit (G-prime) and a green light-emitting unit. The hole transport unit (G-prime) may be formed by mixing two hole transport materials having different carrier mobility.

The green light-emitting unit G may include a green host light-emitting material G-host and a green phosphorescent material G-dopant, in which the G-host may include the following compound (G-1) and the G-dopant may include the following compound (G-2):

(G-1)

, and (G-2)

.

The blue light-emitting device B of the OLED display panel in each of the 3 examples may include a blue host light-emitting material B-host and a blue fluorescent material B-dopant, in which the B-host may include the following compound (B-1) and the B-dopant may include the following compound (B-2):

(B1)

, and (B2)

The mobility of the hole transport layer formed by mixing the first hole transport material and the second hole transport material may vary in the three OLED display panels (i.e., examples 1 to 3). In example 1, the hole transport layer may be formed by mixing the hole transport material HTL1 described in the compound (1) and the hole transport material HTL2 described in the compound (2) in a volume ratio of approximately 1:1, i.e.

In example 2, the hole transport layer may be formed by mixing the hole transport material HTL3 described in the compound (3) and the hole transport material HTL2 described in the compound (2) in a volume ratio of approximately 1:1, i.e.

In example 3, the hole transport layer may be formed by mixing the hole transport material HTL1 described in the compound (1) and the hole transport material HTL3 described in the compound (3) in a volume ratio of approximately 1:1, i.e.

(1)

(3)

The LUMO of the hole transport material HTL1 described in the compound (1) may be approximately 2.3 eV, and the mobility of the hole transport material HTL1 may be approximately $7*10^{-4}$(cm$^2$/Vs). The LUMO of the hole transport material HTL2 described in the compound (2) may be approximately 2.5 eV, and the mobility of the hole transport material HTL2 may be approximately $2*10^{-5}$(cm$^2$/Vs). The LUMO of the hole transport material HTL3 described in the compound (3) may be approximately 2.3 eV, and the mobility of the hole transport material HTL3 may be approximately $4*10^{-4}$(cm$^2$/Vs).

The absolute value of the LUMO difference between the hole transport material HTL1 and the hole transport material HTL2 may be approximately 0.2 eV. The absolute value of the LUMO difference between the hole transport material HTL3 and the hole transport material HTL2 may be approximately 0.2 eV. The absolute value of the LUMO difference between the hole transport material HTL1 and the hole transport material HTL3 may be approximately 0 eV.

The ratio of the hole mobility of the hole transport material HTL1 to the hole transport material HTL2 may be approximately 35. The ratio of the hole mobility of the hole transport material HTL3 to the hole transport material HTL2 may be approximately 20. The ratio of the hole mobility of the hole transport material HTL1 to the hole transport material HTL3 may be approximately 1.75.

The OLED display panels of examples 1 to 3 may have the following structure, respectively.

Example 1

R: Buffer/HIL/HTL1:HTL2/R-Prime/R-host:R-dopant/ETL1:ETL2/Cathode/CPL;
G: Buffer/HIL/HTL1:HTL2/G-Prime/G-host:G-dopant/ETL1:ETL2/Cathode/CPL;
B: Buffer/HIL/HTL1:HTL2/B-host:B-dopant/ETL1:ETL2/Cathode/CPL.

Example 2

R: Buffer/HIL/HTL3:HTL2/R-Prime/R-host:R-dopant/ETL1:ETL2/Cathode/CPL;
G: Buffer/HIL/HTL3:HTL2/G-Prime/G-host:G-dopant/ETL1:ETL2/Cathode/CPL;
B: Buffer/HIL/HTL3:HTL2/B-host:B-dopant/ETL1:ETL2/Cathode/CPL.

Example 3

R: Buffer/HIL/HTL1:HTL3/R-Prime/R-host:R-dopant/ETL1:ETL2/Cathode/CPL;
G: Buffer/HIL/HTL1:HTL3/G-Prime/G-host:G-dopant/ETL1:ETL2/Cathode/CPL;
B: Buffer/HIL/HTL1:HTL3/B-host:B-dopant/ETL1:ETL2/Cathode/CPL.

In the OLED display panel shown in example 1, when a light-emitting device of any color is turned on, the OLED display panel emits light evenly, and undesired light is not emitted by the light-emitting devices adjacent to the turned-on light-emitting. The luminous efficiency of the blue light-emitting device is approximately 120%.

In the OLED display panel shown in example 2, when a light-emitting device of any color is turned on, the OLED display panel emits light evenly, and undesired light is not emitted by the light-emitting devices adjacent to the turned-on light-emitting device. The luminous efficiency of the blue light-emitting device is approximately 110%.

In the OLED display panel shown in example 3, when the blue light-emitting device B is turned on, undesired light is emitted by the adjacent light-emitting device R and by the adjacent light-emitting device G, but the emitted undesired light is insignificant. The luminous efficiency of the blue light-emitting device is approximately 100%.

Thus, according to the OLED display panels shown in examples 1-3, through configuring the hole transport layer by mixing the first hole transport material and the second hole transport material having different mobility, the undesired light emitted by the light-emitting device adjacent to the turned-on light-emitting device may be suppressed. That is, the undesired light emitted by the subpixels adjacent to the turned-on subpixel may be suppressed.

Figure 6:
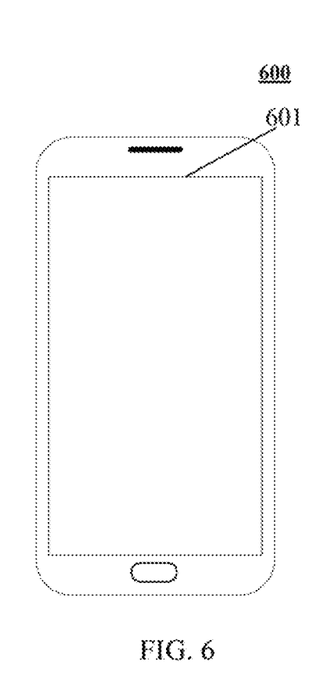
FIG. 6 illustrates a schematic view of an exemplary OLED display device consistent with disclosed embodiments.

The present disclosure also provides an OLED display device. FIG. 6 illustrates a schematic view of an exemplary OLED display device 600 consistent with disclosed embodiments. As shown in FIG. 6, the OLED display device 600 may include any one of the disclosed OLED display panels 601. The disclosed OLED display device 600 may be a cell phone, a tablet, a monitor, and a smart wearable display device, etc. Any OLED display device comprising any one of the disclosed OLED display panels will fall within the scope of the present disclosure. Although a smart phone is shown FIG. 6, the disclosed OLED display device is not limited to the smart phone.

In one embodiment, the OLED display panel may have a top-emitting structure, in which the light generated by the light-emitting device is transmitted outside through the surface on the same side as the second electrode layer. In another embodiment, the OLED display panel may have a bottom-emitting structure, in which the light generated by the light-emitting device is transmitted outside through the surface on the same side as the first electrode. In another embodiment, the OLED display panel may have a double-sided light-emitting structure, in which the light generated by the light-emitting device is transmitted outside through the surface on the same side as the second electrode layer and the surface on the same side as the first electrode simultaneously.

Those skilled in the art would understand that the film materials and properties may be selected according to various application scenarios. In one embodiment, when the OLED display panel has a top-emitting structure, the second electrode layer may be formed by a semi-transparent or transparent conductive material. In another embodiment, when the OLED display panel has a bottom-emitting structure, the light transmittance of the second electrode layer may not have to be defined.

In one embodiment, the light-emitting devices may include light-emitting materials of different colors. For example, a red light-emitting device may be formed by a red light-emitting material, a green light-emitting material may be formed by a green light-emitting material, and a blue light-emitting device may be formed by a blue light-emitting material.

In another embodiment, the light-emitting device may comprise a white light-emitting element and a color filter film. For example, the red light-emitting device may comprise a white light-emitting element and a red filter film which are arranged in layers; the green light-emitting device may comprise a white light-emitting element and a green filter film which are arranged in layers; the blue light-emitting device may comprise a white light-emitting element and a blue color filter film arranged in layers.

Further, the light-emitting element and the filter film may be arranged according to the light-emitting structure of the OLED display panel. For example, a color filter film in the top-emitting light-emitting structure may be disposed on the surface of the light-emitting element far away from the first electrode layer.

In the disclosed OLED display panels, the first electrode layer may include a plurality of electrode blocks or a plurality of striped electrodes, and the second electrode layer may be a sheet electrode or include a plurality of striped electrodes. The electrode shapes and structures are for illustrative purposes and are not intended to limit the scope of the present disclosure. The electrode shapes and structures may vary according to various application scenarios.

The disclosed OLED display panel may comprise a first substrate, a first electrode layer, a hole transport layer, a plurality of light-emitting devices, an electron transport layer, a second electrode layer, and a plurality of first electrodes. The first electrode layer may be disposed on the first substrate and may comprise the plurality of first electrodes. The hole transport layer may be disposed on the surface of the first electrode layer far away from the first substrate and may be formed by mixing the first hole transport material and the second hole transport material having different carrier mobility. The plurality of light-emitting devices may be disposed on the hole transport layer far away from the first electrode layer and may be disposed in correspondence with the plurality of first electrodes respectively.

Through providing the hole transport layer formed by mixing the first hole transport material and the second hole transport material having different carrier mobility, the lateral drift velocity of the carriers in the turned-on light-emitting device drifting to the adjacent light-emitting devices may be reduced, such that the undesired light emitted by light-emitting devices adjacent to the turned-on light-emitting device may be suppressed. Accordingly, the crosstalk of the OLED display panels and devices may be reduced, and the performance of the OLED display panels and devices may be improved.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An organic light-emitting diode (OLED) display panel, comprising:
    a first substrate;
    a first electrode layer disposed on the first substrate and including a plurality of first electrodes;
    a hole transport layer disposed on a surface of the first electrode layer on a side away from the first substrate, and the hole transport layer being formed by a first hole transport material and a second hole transport material having different carrier mobility;
    a plurality of light-emitting devices disposed on a surface of the hole transport layer on a side away from the first electrode layer and arranged in correspondence with the plurality of first electrodes respectively;
    an electron transport layer disposed on a surface of the plurality of light-emitting devices on a side away from the hole transport layer; and
    a second electrode layer disposed on a surface of the electron transport layer on a side away from the plurality of light-emitting devices.

2. The OLED display panel according to claim 1, wherein:
    an absolute value of a difference between a lowest unoccupied molecular orbital of the first hole transport material and a lowest unoccupied molecular orbital of the second hole transport material is greater than or equal to approximately 0.2 eV.

3. The OLED display panel according to claim 1, wherein:
    a ratio of a mobility of the first hole transport material to a mobility of the second hole transport material is greater than or equal to approximately 10.

4. The OLED display panel according to claim 1, wherein:
    the hole transport layer further includes a plurality of first hole transport units;
    the plurality of first hole transport units are arranged in correspondence with the plurality of light-emitting devices, respectively; and
    the plurality of light-emitting devices are disposed on a surface of the plurality of first hole transport units far away from the first electrode layer.

5. The OLED display panel according to claim 4, wherein:
    the plurality of light-emitting devices include m number of colors, where m is a positive integer great than or equal to 3;
    one light-emitting device corresponds to one color;
    the hole transport units corresponding to the light-emitting devices of at most (m-1) number of colors are formed by the first hole transport material or the second hole transport material; and the hole transport units corresponding to the light-emitting devices of at least one color are formed by mixing the first hole transport material and the second hole transport material.

6. The OLED display panel according to claim 1, wherein:
the light-emitting devices include m number of colors, where m is a positive integer great than or equal to 3;
one light-emitting device corresponds to one color; and
the light-emitting devices of at least one color each includes a second hole transport unit and a light-emitting unit, and the second hole transport unit is disposed on the hole transport layer on a side away from the first electrode layer.

7. The OLED display panel according to claim 6, wherein:
the second hole transport unit is formed by at least one of the first hole transport material and the second hole transport material.

8. The OLED display panel according to claim 1, wherein:
the first hole transport material includes a carbazole-containing compound or a triphenylamine-containing compound; and
the second hole transport material includes a carbazole-containing compound or a triphenylamine-containing compound.

9. The OLED display panel according to claim 8, wherein:
the first hole transport material includes a compound having a chemical formula of and the second hole transport material includes a compound having a chemical formula of 10. The OLED display panel according to claim 8, wherein:
the first hole transport material includes a compound having a chemical formula of and the second hole transport material includes a compound having a chemical formula of 11. The OLED display panel according to claim 1, wherein:
the plurality of light-emitting devices include a plurality of red light-emitting devices, a plurality of green light-emitting devices, and a plurality of blue light-emitting devices.

12. The OLED display panel according to claim 11, wherein:
the plurality of light-emitting devices further include a plurality of yellow light-emitting devices, or a plurality of white light-emitting devices.

13. The OLED display panel according to claim 11, wherein:
a red light-emitting device comprises a white light-emitting element and a red filter film arranged in layers;
a green light-emitting device comprises a white light-emitting element and a green filter film arranged in layers; and
a blue light-emitting device comprises a white light-emitting element and a blue filter film arranged in layers.

14. The OLED display panel according to claim 11, wherein:
- both a red light-emitting device and a green light-emitting include a phosphorescent material; and
- a blue light-emitting device includes a fluorescent material.

15. The OLED display panel according to claim 14, wherein:
- the red light-emitting device includes one type of first host material or two types of first host materials, and the first host material includes a carbazole-containing compound;
- the green light-emitting device includes at least two types of second host materials, and the at least two types of second host materials include a carbazole-containing compound; and
- the blue light-emitting device includes one type of third host material or two types of third host materials, and the third host material includes an aromatic compound.

16. The OLED display panel according to claim 1, wherein the first electrode further includes at least:
- a reflective film disposed on the first substrate and including silver; and
- a transparent conductive film disposed on a surface of the reflective film on a side away from the first substrate, and including indium tin oxide or indium zinc oxide.

17. The OLED display panel according to claim 1, wherein:
- the second electrode includes at least any one of a magnesium-silver alloy, a silver metal, a silver-ytterbium alloy, and a silver-rare earth metal alloy.

18. The OLED display panel according to claim 1, wherein:
- the first substrate is a flexible substrate or a rigid substrate.

19. The OLED display panel according to claim 18, wherein:
- the flexible substrate includes polyimide or a polyethylene terephthalate resin.

20. An organic light-emitting diode (OLED) display device, comprising the OLED display panel according to claim 1.

* * * * *